United States Patent
Rehner et al.

(10) Patent No.: US 11,874,350 B2
(45) Date of Patent: Jan. 16, 2024

(54) LOCAL COIL WITH DETUNING FUNCTION

(71) Applicant: Siemens Healthcare GmbH, Erlangen (DE)

(72) Inventors: Robert Rehner, Neunkirchen am Brand (DE); Helmut Greim, Adelsdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 121 days.

(21) Appl. No.: 17/216,588

(22) Filed: Mar. 29, 2021

(65) Prior Publication Data
US 2021/0302516 A1 Sep. 30, 2021

(30) Foreign Application Priority Data
Mar. 30, 2020 (DE) ..................... 10 2020 204 067.2

(51) Int. Cl.
*G01R 33/36* (2006.01)
*G01R 33/34* (2006.01)

(52) U.S. Cl.
CPC ..... *G01R 33/365* (2013.01); *G01R 33/34084* (2013.01)

(58) Field of Classification Search
CPC ............ G01R 33/365; G01R 33/34084; G01R 33/34007; G01R 33/3415; G01R 33/3657; G01R 33/341; G01R 33/36; A61B 5/055
USPC ........................................................ 324/322
See application file for complete search history.

(56) References Cited

U.S. PATENT DOCUMENTS

| 4,724,389 A | 2/1988 | Hyde et al. |
| 4,733,190 A | 3/1988 | Dembinski |
| 10,677,864 B2 * | 6/2020 | Lin .................... G01R 33/3628 |

(Continued)

FOREIGN PATENT DOCUMENTS

| CN | 101088020 A | 12/2007 |
| CN | 101183603 A | 5/2008 |

(Continued)

OTHER PUBLICATIONS

Malzacher, Matthias. Simulation and development of RF resonators for preclinical and clinical 1H and X-nuclei MRI. Diss. 2019. pp. 1-110.

(Continued)

*Primary Examiner* — Christopher P McAndrew
(74) *Attorney, Agent, or Firm* — Lempia Summerfield Katz LLC

(57) ABSTRACT

A local coil includes a coil element in the form of a loop. The coil element includes a first conductor, a second conductor, and a third conductor. The coil element includes a first dielectric and a second dielectric. The first dielectric is arranged between the first conductor and the second conductor, and the second dielectric is arranged between the second conductor and the third conductor. The coil element includes a receive unit that includes the first conductor and the second conductor, and a detuning unit that includes the third conductor. In a first operating state of the coil element, the receive unit has a first resonant frequency. In a second operating state of the coil element, the detuning unit is configured to detune the resonant frequency of the receive unit so that the receive unit has a second resonant frequency different than the first resonant frequency.

20 Claims, 3 Drawing Sheets

(56) References Cited

U.S. PATENT DOCUMENTS

| | | | |
|---|---|---|---|
| 2003/0097064 A1* | 5/2003 | Talpade | A61B 5/055 600/434 |
| 2005/0251031 A1* | 11/2005 | Smith | G01R 33/3628 600/433 |
| 2008/0084254 A1 | 4/2008 | Takahashi et al. | |
| 2009/0243611 A1 | 10/2009 | Holle et al. | |
| 2010/0039113 A1 | 2/2010 | Vartiovaara | |
| 2010/0060283 A1 | 3/2010 | Findeklee et al. | |
| 2012/0313645 A1 | 12/2012 | Biber | |
| 2013/0119991 A1 | 5/2013 | Soutome et al. | |
| 2013/0165768 A1 | 6/2013 | Biber | |
| 2013/0249560 A1 | 9/2013 | Okamoto et al. | |
| 2016/0181826 A1 | 6/2016 | Badr et al. | |
| 2018/0284203 A1 | 10/2018 | Lin et al. | |
| 2019/0123717 A1 | 4/2019 | Gavryliuk et al. | |
| 2019/0235034 A1 | 8/2019 | Greim et al. | |
| 2019/0331745 A1 | 10/2019 | Chen et al. | |
| 2021/0208220 A1* | 7/2021 | Brown | G01R 33/3415 |

FOREIGN PATENT DOCUMENTS

| | | |
|---|---|---|
| CN | 101573630 A | 11/2009 |
| CN | 101819263 A | 9/2010 |
| CN | 201662614 U | 12/2010 |
| CN | 102809734 A | 12/2012 |
| CN | 102905618 A | 1/2013 |
| CN | 102958432 A | 3/2013 |
| CN | 103169473 A | 6/2013 |
| CN | 103516354 A | 1/2014 |
| CN | 205353333 U | 6/2016 |
| CN | 106264527 A | 1/2017 |
| CN | 207368759 U | 5/2018 |
| CN | 108663642 A | 10/2018 |
| CN | 109031172 A | 12/2018 |
| CN | 110398704 A | 11/2019 |

OTHER PUBLICATIONS

Manglberger, M., "Design, simulation and implementation of the detuning of Magnetic resonance receiving antennas with the help of coupled conductor loops" Thesis, chapters 3.3 and 4.4, May 2006, with a machine translation.

Fang Zanfeng et al: "Analysis of power relationship and frequency detuning in magnetic-resonant wireless power transfer", Journal of Guangxi University( Nat Sci Ed) vol. 42 No. 3. pp. 1-14, Jun. 2017.

Wang Lei et al:"Wireless power transfer apparatus design for implanted medical device", Chinese Medical Equipment Journal vol. 38•No.4. pp. 1-12. Apr. 2017.

Xin Wenhui et al: "New method for tuning by phase-controlled capacitor in magnetic-resonant wireless power transfer", Electric Machines and Control, vol. 20 No. 12. pp. 1-24. Dec. 2016.

* cited by examiner

A-A

LOCAL COIL WITH DETUNING FUNCTION

This application claims the benefit of German Patent Application No. DE 10 2020 204 067.2, filed on Mar. 30, 2020, which is hereby incorporated by reference in its entirety.

BACKGROUND

The present embodiments relate to a local coil and a magnetic resonance device.

Magnetic resonance devices are imaging devices that, for the purpose of depicting an examination object, align nuclear spins of the examination object by a strong external magnetic field and excite the nuclear spins into precession about this alignment by a magnetic alternating field. The precession or return of the spins from this excited state into a state having less energy then generates, in response, a magnetic alternating field (e.g., a magnetic resonance signal) that is received via antennas.

In order to excite the precession of the spins, high-frequency (HF) magnetic alternating fields, having a frequency that corresponds to the Larmor frequency at the respective static magnetic field strength, and very high field strengths are required. In order to improve the signal-to-noise ratio of the magnetic resonance signal received by the antennas, use is often made of local coils (e.g., surface coils) that are arranged as close to the patient as possible. An antenna typically has the form of a loop. An antenna may also be referred to as a coil element. A local coil often includes a plurality of coil elements, these forming a coil array.

In addition to local coils that are configured for specific body parts and usually have a rigid housing (e.g., head coils or knee coils), flexible local coils that are intended to be molded as precisely as possible to the body part to be examined are also available. In order to provide optimum moldability, the electronic components within the local coil should be as small as possible and/or mechanically flexible.

In this type of configuration, one electronic core component is the antenna that receives the magnetic resonance signal. This is conventionally a metal such as, for example, copper as a conductor track that is mounted on a flexible circuit board as a substrate. An antenna is usually suitable for receiving magnetic resonance signals when a resonant frequency corresponds to the frequency of the magnetic resonance signals. In order to tune the resonant frequency of the antenna to the frequency of the magnetic resonance signals, use is typically made of concentrated and/or rigid structural elements. Such structural elements may be, for example, capacitors (e.g., SMD capacitors).

The use of this technology has the disadvantage that the antenna may only be properly bent about one axis (e.g., similar to a sheet of paper), and three-dimensional molding to a body part (e.g., a potbelly) is not easily possible. Moreover, there is a danger with a small bending radius and being bent many times that the conductor tracks of the antenna become detached from the substrate or break. The use of concentrated or and/or rigid capacitors within the antenna again produces stiffnesses that are likewise disadvantageous in terms of flexibility. There is also a danger that these will break under stress.

A further important functional unit of a commonplace local coil today is a detuning circuit, which is usually arranged in a rigid housing. The detuning circuit includes, for example, an inductor and a PIN diode that are connected in parallel with a capacitor within the loop of the antenna. During the operation of a magnetic resonance device, and during a transmit phase, a transmit coil (e.g., a body coil that is permanently integrated into the magnetic resonance device) transmits the magnetic alternating fields that are required to excite the precession of the spins. These alternating fields are often referred to as excitation pulses. During the transmit phase, the inductor together with the capacitor form a rejector circuit and open the antenna such that the field of the transmit coil is not disrupted.

In order that the detuning is as effective as possible, the inductor should have a high value and be of high quality. Use is therefore typically made of air-core coils, which require a large amount of space. During the transmit phase, a significant HF current flows in the detuning circuit and also heats up the inductor to a considerable extent. In order that the heat may be adequately distributed, a corresponding volume is required within the rigid housing of the detuning circuit. The size of this housing likewise has a disadvantageous effect on the flexibility of the local coil.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a local coil that at least partially overcomes the described disadvantages of the prior art is provided.

A local coil that includes at least one coil element in the form of a loop (e.g., a closed loop) is therefore provided. The at least one coil element includes a first conductor, a second conductor, and a third conductor. These conductors are usually electrical conductors made of copper, for example. The at least one coil element further includes a first dielectric and a second dielectric. The first dielectric is arranged between the first conductor and the second conductor, and the second dielectric is arranged between the second conductor and the third conductor. A dielectric is usually a substance that has low conductivity or is non-conductive, in which electrical charge carriers cannot move freely. The coil element includes a receive unit that includes the first conductor and the second conductor, and a detuning unit that includes the third conductor. In a first operating state of the coil element (e.g., during a receive phase), the receive unit has a first resonant frequency as a resonant frequency. In a second operating state of the coil element, the detuning unit is configured to detune the resonant frequency of the receive unit so that the receive unit has a second resonant frequency, different than the first resonant frequency, as a resonant frequency.

The first conductor, the second conductor, the third conductor, the first dielectric, and the second dielectric may run next to each other along the loop (e.g., parallel to each other).

The described arrangement of two adjacent conductors with a dielectric disposed between the two adjacent conductors results in the formation of a capacitance. For the purpose of developing the first capacitance and/or the second capacitance, the first conductor, the second conductor, and/or the third conductor has, in each case, an electrically conductive area that is capacitively coupled to an adjacent conductor.

For example, as a result of the described arrangement of the first conductor and the second conductor with the first dielectric between the first conductor and the second conductor, a first capacitance (e.g., an electrical capacitance)

develops. This first capacitance may be used to set the receive unit to the first resonant frequency in the first operating state. Consequently, the use of concentrated and/or rigid capacitors in the local coil may be reduced, whereby the local coil may be embodied in a more flexible manner, for example.

In the second operating state, the receive unit may have a first inductance (e.g., a first self-inductance), and the detuning unit may have a second inductance (e.g., a second self-inductance). Both the first inductance and the second inductance may be inductors that are distributed over the loop and are, for example, not concentrated. The first inductor and the second inductor may produce a reverse coupling, such that the resonant frequency of the detuning unit is detuned to the second resonant frequency in the second operating state.

The coil element may be configured such that, in the second operating state, a coupled high-frequency magnetic alternating field (e.g., a B1 field) induces a first current in the first conductor and/or the second conductor and induces a second current that is opposed to the first current in the third conductor, such that a field-effective total current of the coil element is at least approximately zero. The first inductance is at least approximately identical to the second inductance.

For example, the third conductor therefore assumes the functionality of a detuning inductor. Consequently, the use of concentrated and/or rigid capacitors in the local coil may be reduced, whereby the local coil may be embodied in a more flexible manner, for example.

The first conductor, the second conductor, the third conductor, the first dielectric, and/or the second dielectric may be flexible (e.g., bendable and/or deformable). The first conductor and/or the second conductor and/or the third conductor includes, for example, a stranded wire (e.g., an electrical conductor that consists of thin single wires and is therefore easy to bend). The first dielectric and/or the second dielectric consist of, for example, a flexible material (e.g. a flexible plastic).

The first resonant frequency may be a frequency of the magnetic resonance signals, so that the receive unit is able to receive magnetic resonance signals. The second resonant frequency may be a detuning frequency; as a result of this, the receive unit is detuned relative to a transmit coil, so that the field of the transmit coil is not disrupted during a transmit phase. The receive unit may not be resonant with the transmit coil during the transmit phase. The receive unit may not be configured to receive magnetic resonance signals if the resonant frequency of the receive unit is detuned in the second operating state of the coil element.

In the proposed arrangement, the heat produced during the transmit phase may be distributed along the entire antenna structure, such that overheated points may be avoided more easily.

According to a further variant of the local coil, the coil element includes a triaxial conductor having an inner conductor, an intermediate conductor, and an outer conductor. The first conductor is the inner conductor, the second conductor is the intermediate conductor, and the third conductor is the outer conductor of the triaxial conductor. In one embodiment, the first conductor may be the outer conductor, the second conductor may be the intermediate conductor, and the third conductor may be the inner conductor of the triaxial conductor.

As a result of the construction as a triaxial conductor (e.g., as a result of the axial symmetry of the triaxial conductor), a particularly high flexibility of the coil element may be achieved in all directions perpendicular to the triaxial conductor.

In the case of a triaxial conductor, the intermediate conductor and the outer conductor may be arranged coaxially around the inner conductor, an outer dielectric may be arranged between the outer conductor and the intermediate conductor, and an inner dielectric may be arranged between the intermediate conductor and the inner conductor.

The first conductor (e.g., the outer conductor) and the intermediate conductor as the second conductor with the outer dielectric between the first conductor and the second conductor work as a cylindrical capacitor, for example, where both the outer conductor and the intermediate conductor have an electrically conductive cylindrical sheath, between which the outer dielectric is situated. Further, the third conductor (e.g., the inner conductor) may work as a detuning inductor.

According to a further variant of the local coil, the detuning unit includes a switch element configured to electrically interrupt the third conductor in the first operating state and to electrically short-circuit the third conductor in the second operating state.

For example, the third conductor is separated at a separation point and the switch element is arranged at the separation point, so that the switch element may electrically interrupt the third conductor in the first operating state and electrically short-circuit the third conductor in the second operating state. For example, the switch element is arranged between two conductor ends of the third conductor, which are formed by the separation point.

The switch element may include, for example, a diode (e.g., a PIN diode), a transistor, and/or a mechanical switch (e.g., a microelectromechanical system (MEMS)). For example, the local coil is configured to electrically short-circuit the third conductor by subjecting the diode to a current and/or to electrically interrupt the third conductor by applying a reverse voltage.

For example, the third conductor is separated at a separation point, and a PIN diode is positioned between the two ends of the separation point. If, for example, the PIN diode is subjected to a current, this forms a short-circuit, and the third conductor is closed again. The coil element becomes detuned. If, for example, a reverse voltage is applied to the PIN diode, the third conductor remains open, and the coil element becomes resonant and may receive magnetic resonance signals.

According to a further variant of the local coil, the at least one coil element includes at least one circuit board. For example, one or a plurality of electrical structural elements may be arranged on the at least one circuit board.

The circuit board may be a rigid circuit board. A rigid circuit board may provide that any electrical structural elements arranged on the circuit board are not damaged (e.g., if a mechanical force acts on the circuit board). If the circuit board was flexible, any soldering points could break as a result of the circuit board bending, for example.

The at least one coil element may include precisely one circuit board. If the coil element includes only a small number of circuit boards (e.g., precisely one circuit board), is it possible to achieve a high flexibility of the coil element. For example, if the at least one circuit board is rigid, a small number of circuit boards is advantageous because the coil element is then stiffened at only a few points.

The circuit board may have an area of less than 15, less than 10, or less than 5 cm$^2$. The circuit board may have an extent (e.g., a separation between two points that are most distant from each other) of less than 10, less than 6, or less than 4 cm. Such small dimensions restrict the flexibility of the at least one coil element only slightly.

According to a further variant of the local coil, the switch element is arranged at the circuit board. For example, the switch element is soldered onto the circuit board. A switch element that is arranged at the circuit board is particularly robust in relation to external stresses. An adapter circuit and/or a preamplifier may also be arranged at the circuit board.

According to a further variant of the local coil, the detuning unit includes at least one inductor (e.g., a concentrated and/or rigid inductor) and/or at least one capacitor (e.g., a concentrated and/or rigid capacitor). Such a capacitor may be an electrical capacitor.

Such an inductor may have a value of less than 1000, less than 700, or less than 500 nH and/or an extent of less than 8, less than 5, or less than 4 cm. Such a capacitor has an extent of less than 7, less than 5, or less than 3 cm.

According to a further variant of the local coil, the at least one inductor and/or the at least one capacitor are arranged in series with the switch element at the third conductor. For example, the at least one inductor and/or the at least one capacitor are arranged at interruption points of the first conductor along the loop.

According to a further variant of the local coil, the first conductor and/or the second conductor are interrupted (e.g., conductively) at least at two interruption points along the loop. This results in the formation of distributed capacitors between the first conductor and the second conductor.

For example, one of the at least two interruptions is situated in the region inside the circuit board, and one or a plurality of interruptions are situated in the region outside the circuit board. The region outside the circuit board may be flexible. As a result of distributed capacitors between the first conductor and the second conductor, it is possible to dispense with concentrated and/or rigid capacitors in the flexible region.

According to a further variant of the local coil, the receive unit includes at least one capacitor (e.g., concentrated and/or rigid) that is arranged at an interruption point of the first conductor. The receive unit may include precisely one capacitor (e.g., concentrated and/or rigid) that is arranged at an interruption point of the first conductor. The at least one capacitor (e.g., concentrated and/or rigid) may be arranged at the circuit board.

A magnetic resonance signal may be picked up via the at least one capacitor (e.g., concentrated and/or rigid) of the receive unit.

According to a further variant of the local coil, a separation between the second conductor and the third conductor and/or capacitively coupled areas of the second conductor and the third conductor and/or the permittivity of the second dielectric are configured such that in the second operating state, the receive unit has the second resonant frequency as a resonant frequency. Using these various parameters, the second resonant prefrequency may be set in a particularly precise and/or simple manner.

According to a further variant of the local coil, a separation between the first conductor and the second conductor and/or capacitively coupled areas of the first conductor and the second conductor and/or the permittivity of the first dielectric are configured such that in the first operating state, the receive unit has the first resonant frequency as a resonant frequency. Using these various parameters, the first resonant prefrequency may be set in a particularly effective manner.

If the coil element is, for example, a triaxial conductor, the lateral areas of the first conductor and the second conductor may be capacitively coupled. For example, the inner lateral area of the outer conductor is capacitively coupled to the outer lateral area of the intermediate conductor.

According to a further variant of the local coil, the triaxial conductor has a diameter between 0.5 and 5 mm. For example, with a diameter between 1 and 3 mm, the diameter is both small enough to provide very good flexibility and large enough to achieve a very good quality of the coil element.

According to a further variant of the local coil, the loop of the at least one coil element is arranged on a flat carrier (e.g., by stitching). The flat carrier may be molded in three dimensions. For example, the flat carrier is a nonwoven fabric.

Also provided is a magnetic resonance device including at least one of the previously described embodiment variants of the local coil. The advantages of the local coil may also apply to the magnetic resonance device.

BRIEF DESCRIPTION OF THE DRAWINGS

Mutually corresponding parts are denoted by the same reference signs in all figures.

DETAILED DESCRIPTION

Figure 1:
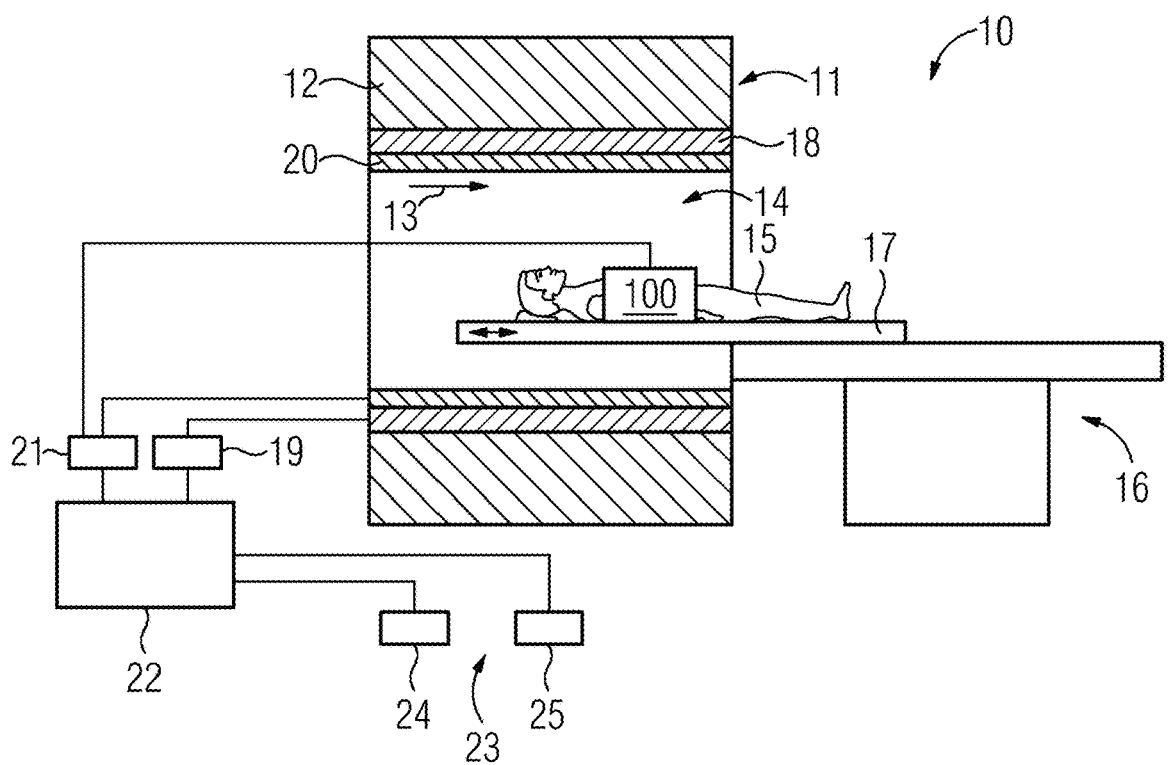
FIG. 1 shows one embodiment of a magnetic resonance device in a schematic illustration.

FIG. 1 schematically illustrates one embodiment of a magnetic resonance device 10. The magnetic resonance device 10 includes a magnet unit 11 that has a main magnet 12 for generating a strong and, for example, temporally constant main magnetic field 13. The magnetic resonance device 10 further includes a patient receiving region 14 for receiving a patient 15. The patient receiving region 14 in the present exemplary embodiment is cylindrical and is cylindrically surrounded by the magnet unit 11 in a circumferential direction. However, a different configuration of the patient receiving region 14 may be provided. The patient 15 may be pushed into the patient receiving region 14 by a patient support device 16 of the magnetic resonance device 10. For this purpose, the patient support device 16 has a patient couch 17 that is so embodied as to be mobile within the patient receiving region 14.

The magnet unit 11 also includes a gradient coil unit 18 for generating magnetic field gradients that are used for spatial encoding during imaging. The gradient coil unit 18 is controlled by a gradient control unit 19 of the magnetic resonance device 10. The magnet unit 11 further includes a high-frequency antenna unit 20 that, in the present exemplary embodiment, is configured as a whole body coil that is permanently integrated into the magnetic resonance device 10. The high-frequency antenna unit 20 is configured to produce an excitation of nuclear spins in the main magnetic field 13 that is generated by the main magnet 12. The high-frequency antenna unit 20 is controlled by a high-frequency antenna control unit 21 of the magnetic resonance device 10 and directs a high-frequency magnetic alternating field into an examination volume that is essentially formed by a patient receiving region 14 of the magnetic resonance device 10. The high-frequency magnetic alternating field has a transmit frequency in this case. The transmit frequency corresponds to the Larmor frequency of the nuclear spins that are to be excited. The high-frequency antenna unit 20 is also configured to receive magnetic resonance signals.

In order to control the main magnet 12, the gradient control unit 19, and the high-frequency antenna control unit 21, the magnetic resonance device 10 has a system control unit 22. The system control unit 22 controls the magnetic resonance device 10 centrally (e.g., by performing a predefined imaging gradient echo sequence). The system control unit 22 further includes an evaluation unit (not shown in greater detail) for evaluating medical image data that is captured during the magnetic resonance examination. The magnetic resonance device 10 further includes a user interface 23 that is connected to the system control unit 22. Control information such as imaging parameters, for example, and reconstructed magnetic resonance images may be displayed to a medical operator on a display unit 24 (e.g., at least a monitor) of the user interface 23. The user interface 23 further includes an input unit 25 by which information and/or parameters may be input by the medical operator during a measurement operation.

The magnetic resonance device 10 also has a local coil 100 that is connected to the high-frequency antenna control unit 21 and is positioned directly at the body of the patient 15. The local coil 100 includes a plurality of coil elements, as illustrated by way of example in FIGS. 2 to 4.

Figure 2:
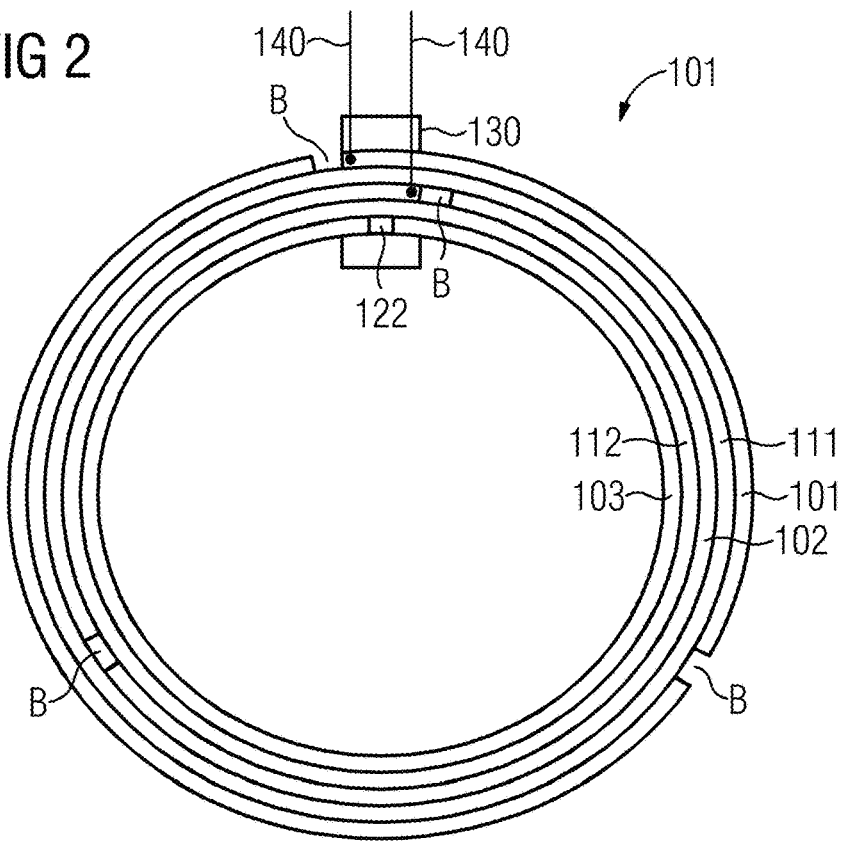
FIG. 2 shows one embodiment of a coil element of a local coil including three conductors arranged next to each other.

FIG. 2 schematically illustrates a loop-shaped coil element 101. This antenna loop includes a first conductor 101, a second conductor 102, a third conductor 103, a first dielectric 111, and a second dielectric 112. The first dielectric 111 is arranged between the first conductor 101 and the second conductor 102, and the second dielectric 112 is arranged between the second conductor 102 and the third conductor 103.

The coil element 101 includes a receive unit that includes the first conductor 111 and the second conductor 112. The coil element further includes a detuning unit that includes the third conductor 113.

The coil element 101 may also include one or a plurality of concentrated and/or rigid structural elements. A structural element may be, for example, a diode, a capacitor, an inductor, or an ohmic resistor. Concentrated and/or rigid structural elements may include a rigid housing, for example.

In a first operating state of the coil element 101, the receive unit has a first resonant frequency as a resonant frequency so that the receive unit may receive magnetic resonance signals (e.g., the first resonant frequency is also tuned to the frequency of the magnetic resonance signals). Further, in a second operating state of the coil element 101, the detuning unit is configured to detune the resonant frequency of the receive unit such that the receive unit has a second resonant frequency, different than the first resonant frequency, as a resonant frequency. The receive unit is, for example, detuned relative to the transmit frequency of the high-frequency antenna unit 20, for example, and therefore, the second resonant frequency may also be referred to as the detuning frequency.

In a transmit phase, the high-frequency antenna unit 20 directs a high-frequency magnetic alternating field into the patient 15. This alternating field is often referred to as a B1 field and has a transmit frequency. This B1 field may be disrupted as little as possible by the local coil 100. Since the transmit frequency has essentially the frequency of the magnetic resonance signals that are triggered thereby, the local coil 100 and, for example, the receive unit thereof would be resonant therewith in the first operating state; therefore, the local coil 100 would interact comparatively strongly with (e.g., disrupt) the B1 field. This may be prevented by detuning the local coil 100 (e.g., the receive unit thereof), so that the local coil 100 is no longer resonant. This takes place in the second operating state of the local coil 100. In a receive phase following thereupon, the local coil 100 then assumes the first operating state again, in order to be able to receive the magnetic resonance signals that are triggered.

For the purpose of switching between the two operating states, the detuning circuit includes, for example, a switch element 122. This is configured to electrically interrupt the third conductor 103 in the first operating state and to electrically short-circuit the third conductor 103 in the second operating state. Depending on whether the third conductor 103 is interrupted or short-circuited, a different magnetic coupling is produced between the third conductor 103 and the second conductor 102, and consequently, the resonant frequency of the receive unit also changes. Further, the capacitive interaction between the second conductor 102 and the first conductor 101 is also influenced, for example, by the permittivity and thickness of the first dielectric 111.

The switch element 122 may be configured, for example, as a concentrated and/or rigid structural element. The receive unit may likewise include one or a plurality of concentrated and/or rigid structural elements (e.g., capacitors). The concentrated and/or rigid structural elements may be secured (e.g., soldered) onto a circuit board 130 (e.g., a PCB). The circuit board 130 may, for example, be rigid (e.g., not flexible). A received magnetic resonance signal may be decoupled via lines 140, which, in this example, are arranged one at the first conductor 101 and one at the second conductor 102. The magnetic resonance signal that is decoupled via the lines 140 may be transferred to, for example, the system control unit 22 of the magnetic resonance device 10 for further processing.

In this example, the first conductor 101 and the second conductor 102 include interruptions B (e.g., in the form of slots) that are so arranged as to be offset relative to each other. Three series-connected capacitances that influence the resonant frequency of the receive unit are realized by the interruptions B.

Figure 3:
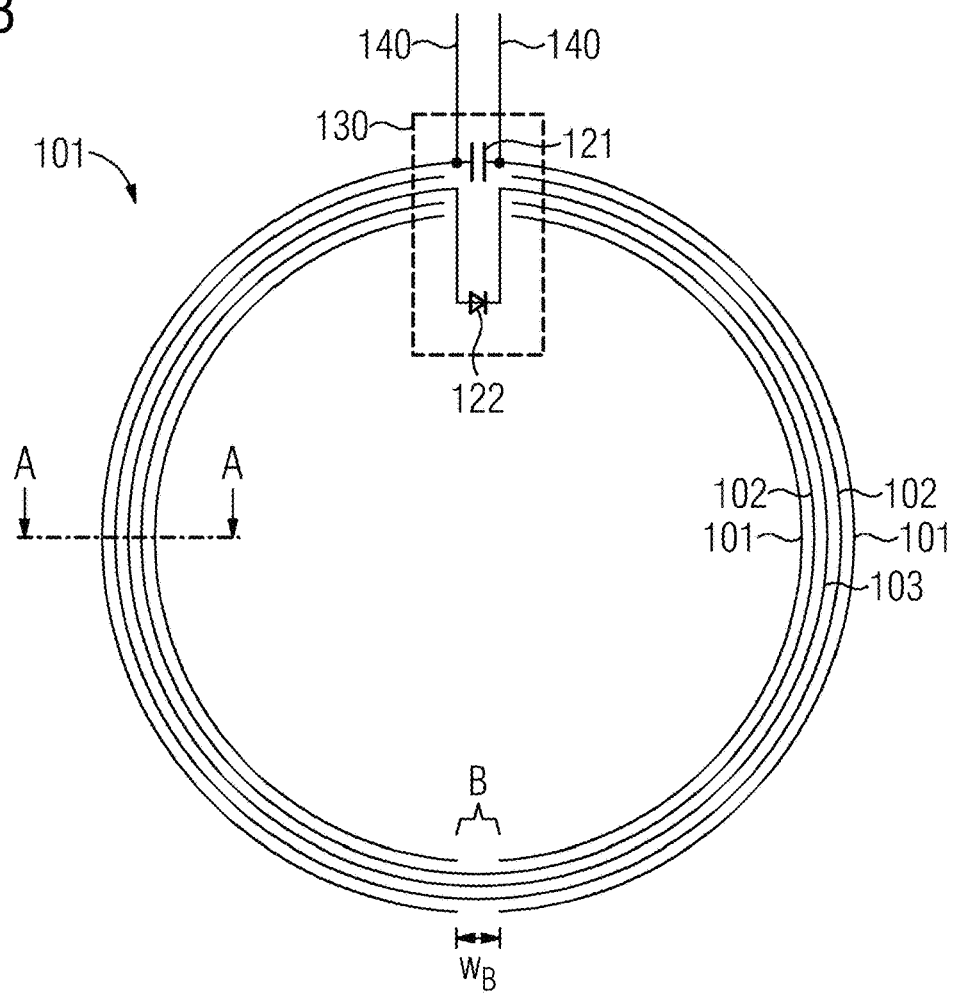
FIG. 3 shows one embodiment of a coil element of a local coil in a triaxial arrangement of the conductors and includes a cross-sectional illustration.
Figure 3:
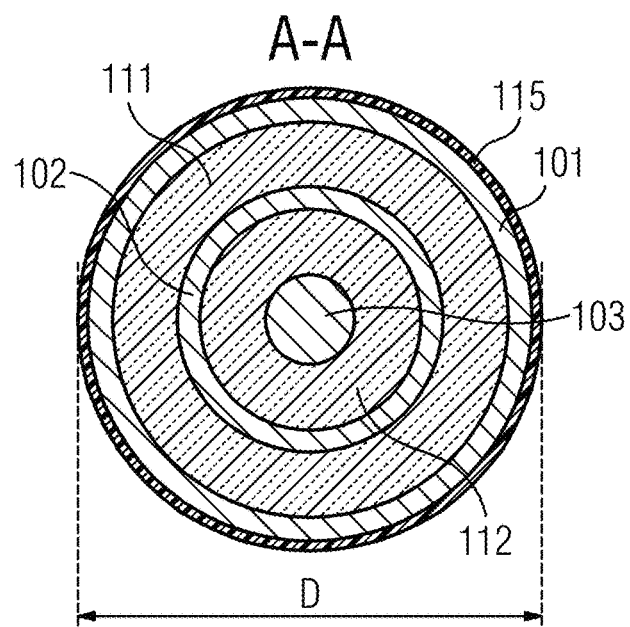

FIG. 3 illustrates an exemplary embodiment of a coil element 101. The conductors 101, 102, 103, and the dielectrics 111, 112 are, for example, arranged in the form of a triaxial conductor, as shown in the magnified cross section A-A: The first conductor 101 as an outer conductor and the second conductor 102 as an intermediate conductor are arranged coaxially around the third conductor 103 as an inner conductor. It is, however, also possible for the third conductor to be the outer conductor and the first conductor the inner conductor. A PIN diode may be arranged at the outer conductor in this case; the outer conductor may be interrupted by the PIN diode in the receive phase in order to avoid shielding of the receive unit. In addition, a thin cable sheath 115, for example, is also arranged around the outer conductor.

The inner conductor 103 assumes, for example, the functionality of the detuning inductor. For this purpose, the inner conductor 103 is separated at one point. A PIN diode 122 is positioned between the two ends as a switch element. If the PIN diode 122 is subjected to a current, the PIN diode forms a short-circuit, and the inner conductor 103 is electrically closed again. The coil element 101 is thereby detuned. If a reverse voltage is present at the PIN diode 122, the inner conductor 103 remains open, and the coil element 101 becomes resonant and may receive magnetic resonance signals.

The use of the inner conductor 103 of the triaxial conductor instead of a conventional detuning inductor offers, for example, the advantage that the circuit board 130, which is, for example, rigid, may be smaller because there is no need for a separate high-quality large inductor. With the exception of the rigid region of the circuit board 130, the coil element is flexible. Further, the heat that is produced during the transmit phase is distributed along the entire antenna structure. Consequently, the structural volume of a housing of the detuning circuit may be significantly reduced.

The first resonant frequency and the second resonant frequency may be tuned by dimensioning the triaxial conductor in a suitable manner. In simple terms, a triaxial conductor may be considered as a system of two cylinder capacitors, each having a capacitance: A first capacitance of outer conductor 101 and intermediate conductor 102 that influences the first resonant frequency, and a second capacitance of intermediate conductor 102 and inner conductor 103 that influences the second resonant frequency. The capacitance C of a cylinder capacitor may be described by $$C = 2\pi\varepsilon_0\varepsilon_r \frac{s}{\ln\frac{R_2}{R_1}}.$$

In this case, $\varepsilon_0$ is the electrical field constant, $\varepsilon_r$ is the permittivity of the corresponding dielectric, s is the length of the cylinder capacitor, $R_2$ is the external radius, and $R_1$ is the internal radius of the areas that are capacitively coupled in each case.

The detuning frequency may be influenced, for example, by the choice of diameter of the inner conductor 103, the thickness, and/or the permittivity of the second dielectric 112. With reference to the formula specified above, $R_1$ here corresponds to the diameter of the inner conductor 103, $R_2$-$R_1$ corresponds to the thickness of the second dielectric 112, and $\varepsilon_r$ corresponds to the permittivity of the second dielectric 112. In addition, the detuning frequency may be influenced, for example, by the positioning of an inductor and/or a capacitor having low values and small structural formats in series with the PIN diode.

The outer conductor 101 together with the intermediate conductor 102 assumes the functionality of, for example, the actual antenna. On the circuit board 130, both the outer conductor 101 and the intermediate conductor 102 are interrupted at an interruption point. A concentrated capacitor 121 is connected between two ends of the outer conductor 101 on the circuit board 130. A received magnetic resonance signal may be decoupled via lines 140, which are both arranged at the first conductor 101 in this example.

Opposite the circuit board 130, the outer conductor 101 is separated at a further interruption point along the loop. As a result of this interruption B, two distributed capacitors are now formed between the outer conductor 101 and the intermediate conductor 102, such that it is possible to dispense with the use of a further capacitor in the flexible region of the coil element 101.

The resonant frequency of the antenna element may, for example, be set by the length $w_B$ of the interruption B of the outer conductor 101 and the value of the capacitor 121 on the circuit board 130. If the interruption B is selected to be larger, for example, the capacitively coupled areas of the outer conductor 101 and the intermediate conductor 102 are reduced accordingly. With reference to the formula specified above, for the capacitance C of a cylinder capacitor, the length s of the cylinder capacitor may be reduced by the length $w_B$ of the interruption B.

A further way of setting the resonant frequency of the coil element 101 is provided by the choice of the thickness and/or the permittivity of the first dielectric 111 between the outer conductor 101 and the intermediate conductor 102. With reference to the formula specified above, $R_2$-$R_1$ corresponds to the thickness, and $\varepsilon_r$ corresponds to the permittivity of the first dielectric 111. In further variants, the intermediate conductor 102 and/or the outer conductor 101 may also be interrupted at further points in order to thus generate further distributed capacitors.

A small overall diameter D may be selected for the triaxial conductor; D may be less than 5 mm (e.g., less than 3 mm), whereby a very high degree of flexibility may be produced. The overall diameter D of the triaxial conductor should, however, not be too thin, so that an adequate quality of the antenna element is nonetheless achieved; D may be greater than 0.5 mm (e.g., greater than 1 mm).

Figure 4:
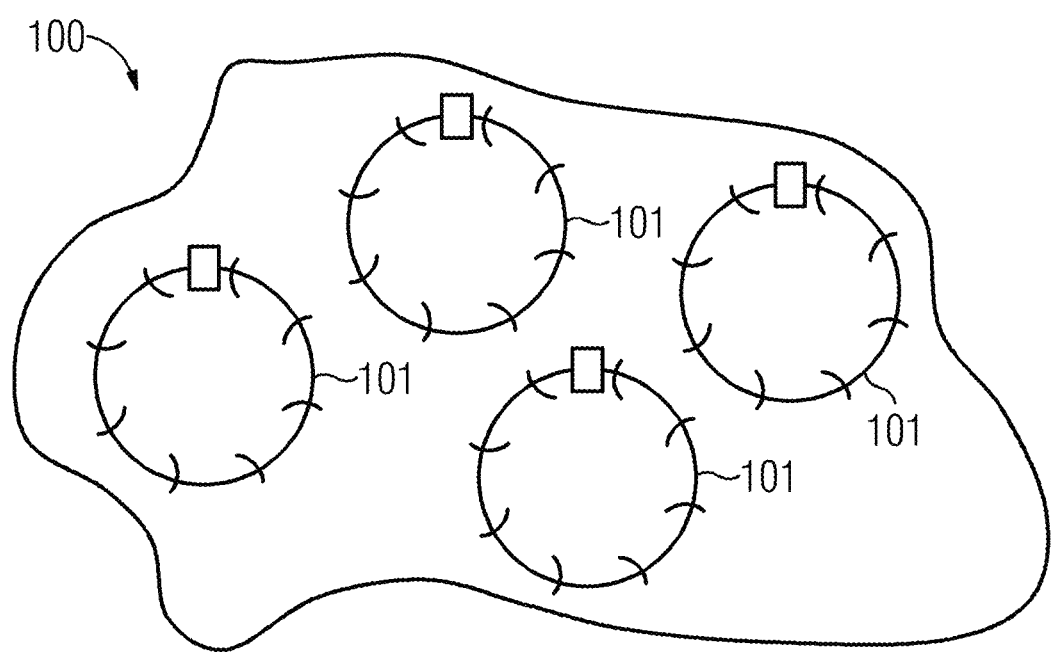
FIG. 4 shows one embodiment of a local coil including four coil elements on a flat carrier.

FIG. 4 represents a local coil 101 with four coil elements 101. The coil elements are, for example, arranged on a flat carrier. The coil elements 101 may be stitched onto a nonwoven fabric, for example. This allows very good three-dimensional moldability of the local coil 100.

In summary, the proposed local coil 100 allows greater flexibility and therefore may be more effectively molded to the body of the patient 15 in comparison with conventional local coils. Concentrated capacitors in the flexible region of the coil elements 101 may be avoided. Any rigid circuit boards 130 may be smaller in size, since no large high-quality detuning inductor is required. Any rigid housings for electronics may also be smaller in size since less heat is produced on the circuit board 130 (e.g., in the transmit phase), but is instead distributed along the antenna loop. Moreover, for example, a triaxial conductor as an antenna allows better three-dimensional moldability of the local coil 100 than a conventional substrate-based antenna.

The devices described in detail above are merely exemplary embodiments that may be modified in all manner of ways by a person skilled in the art without thereby departing from the scope of the invention. Further, the use of the indefinite article "a" or "an" does not exclude multiple instances of the relevant features. Likewise, the term "unit" does not exclude the relevant components consisting of a plurality of interacting subcomponents, which may also be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil comprising:
   at least one coil element in the form of a loop, the at least one coil element comprising:
      a first conductor;
      a second conductor;
      a third conductor;
      a first dielectric; and
      a second dielectric, wherein the first dielectric is arranged between the first conductor and the second conductor, and wherein the second dielectric is arranged between the second conductor and the third conductor;
      a receive unit that comprises the first conductor and the second conductor;
      a detuning unit that comprises the third conductor,
   wherein in a first operating state of the at least one coil element, the receive unit has a first resonant frequency as a resonant frequency,
   wherein in a second operating state of the at least one coil element, the detuning unit is configured to detune the resonant frequency of the receive unit so that the receive unit has a second resonant frequency as the resonant frequency, the second resonant frequency being different than the first resonant frequency, and
   wherein a capacitance is formed as a result of the arrangement of the first dielectric between the first conductor and the second conductor, the capacitance configured to be used to set the receive unit to the first resonant frequency in the first operating state.

2. The local coil of claim 1, wherein the at least one coil element further comprises a triaxial conductor having an inner conductor, an intermediate conductor, and an outer conductor, and
   wherein:
      the first conductor is the inner conductor, the second conductor is the intermediate conductor, and the third conductor is the outer conductor of the triaxial conductor; or
      the first conductor is the outer conductor, the second conductor is the intermediate conductor, and the third conductor is the inner conductor of the triaxial conductor.

3. The local coil of claim 1, wherein the detuning unit further comprises a switch element that is configured to:
   electrically interrupt the third conductor in the first operating state; and
   electrically short-circuit the third conductor in the second operating state.

4. The local coil of claim 3, wherein the switch element is a diode.

5. The local coil of claim 3, wherein the at least one coil element further comprises at least one circuit board.

6. The local coil of claim 5, wherein the switch element is arranged at the circuit board.

7. The local coil of claim 1, wherein the detuning unit further comprises at least one inductor, at least one capacitor, or the at least one inductor and the at least one capacitor.

8. The local coil of claim 5, wherein at least one inductor, at least one capacitor, or the at least one inductor and the at least one capacitor are arranged in series with the switch element at the third conductor.

9. The local coil of claim 1, wherein the first conductor, the second conductor, or the first conductor and the second conductor are interrupted at least at two interruption points along the loop.

10. The local coil of claim 9, wherein the at least one coil element further comprises at least one circuit board, and
   wherein one of the at least two interruption points is arranged at the circuit board.

11. The local coil of claim 1, wherein the receive unit further comprises at least one capacitor that is arranged at an interruption point of the first conductor.

12. The local coil of claim 11, wherein the at least one coil element further comprises at least one circuit board, and
   wherein the at least one capacitor is arranged at the circuit board.

13. The local coil of claim 1, wherein inductively coupled areas of the second conductor and the third conductor, a thickness of the third conductor, a thickness, a permittivity of the second dielectric, or any combination thereof is configured such that in the second operating state, the receive unit has the second resonant frequency as the resonant frequency.

14. The local coil of claim 1, wherein capacitively coupled areas of the first conductor and the second conductor, a thickness, a permittivity of the first dielectric, or any combination thereof is configured such that, in the first operating state, the receive unit has the first resonant frequency as the resonant frequency.

15. The local coil of claim 2, wherein the triaxial conductor has a diameter between 0.5 and 5 mm.

16. The local coil of claim 15, wherein the diameter of the triaxial conductor is between 1 and 3 mm.

17. The local coil of claim 1, wherein the at least one coil element is arranged on a flat carrier.

18. The local coil of claim 17, wherein the at least one coil element is stitched on the flat carrier.

19. A magnetic resonance device comprising:
   at least one local coil, a local coil of the at least one local coil comprising:
      at least one coil element in the form of a loop, the at least one coil element comprising:
         a first conductor;
         a second conductor;
         a third conductor;
         a first dielectric; and
         a second dielectric, wherein the first dielectric is arranged between the first conductor and the second conductor, and wherein the second dielectric is arranged between the second conductor and the third conductor;
         a receive unit that comprises the first conductor and the second conductor;
         a detuning unit that comprises the third conductor,
      wherein in a first operating state of the at least one coil element, the receive unit has a first resonant frequency as a resonant frequency,
      wherein in a second operating state of the at least one coil element, the detuning unit is configured to detune the resonant frequency of the receive unit so that the receive unit has a second resonant frequency as the resonant frequency, the second resonant frequency being different than the first resonant frequency, and
      wherein a capacitance is formed as a result of the arrangement of the first dielectric between the first conductor and the second conductor, the capacitance configured to be used to set the receive unit to the first resonant frequency in the first operating state.

20. A local coil comprising:
at least one coil element in the form of a loop, the at least one coil element comprising:
  a first conductor;
  a second conductor;
  a third conductor;
  a first dielectric; and
  a second dielectric, wherein the first dielectric is arranged between the first conductor and the second conductor, and wherein the second dielectric is arranged between the second conductor and the third conductor;
  a receive unit that comprises the first conductor and the second conductor;
  a detuning unit that comprises the third conductor,
wherein in a first operating state of the at least one coil element, the receive unit has a first resonant frequency as a resonant frequency,
wherein in a second operating state of the at least one coil element, the detuning unit is configured to detune the resonant frequency of the receive unit so that the receive unit has a second resonant frequency as the resonant frequency, the second resonant frequency being different than the first resonant frequency,
wherein the detuning unit further comprises a switch element that is configured to:
  electrically interrupt the third conductor in the first operating state; and
  electrically short-circuit the third conductor in the second operating state.

* * * * *